United States Patent
Chen

(10) Patent No.: US 9,810,739 B2
(45) Date of Patent: Nov. 7, 2017

(54) ELECTRONIC SYSTEM, SYSTEM DIAGNOSTIC CIRCUIT AND OPERATION METHOD THEREOF

(71) Applicant: ANDES TECHNOLOGY CORPORATION, Hsin-Chu (TW)

(72) Inventor: Zhong-Ho Chen, Taichung (TW)

(73) Assignee: ANDES TECHNOLOGY CORPORATION, Hsin-Chu (TW)

( * ) Notice: Subject to any disclaimer, the term of this patent is extended or adjusted under 35 U.S.C. 154(b) by 119 days.

(21) Appl. No.: 14/924,682

(22) Filed: Oct. 27, 2015

(65) Prior Publication Data

US 2017/0115343 A1    Apr. 27, 2017

(51) Int. Cl.
    *G01R 31/28*     (2006.01)
    *G01R 31/3177*     (2006.01)
    *G01R 31/3185*     (2006.01)
    *G11C 29/00*     (2006.01)

(52) U.S. Cl.
    CPC . *G01R 31/3177* (2013.01); *G01R 31/318555* (2013.01); *G01R 31/318588* (2013.01); *G11C 29/00* (2013.01)

(58) Field of Classification Search
    CPC ........ G01R 31/3177; G01R 31/318508; G01R 31/318513; G01R 31/318555; G01R 31/31725; G01R 31/318597; G01R 31/31723; G01R 31/31724; G01R 31/318536; G01R 31/31727; G01R 31/318558; G01R 31/318563; G01R 31/318572; G06F 17/5081
See application file for complete search history.

(56) References Cited

U.S. PATENT DOCUMENTS

| | | | |
|---|---|---|---|
| 5,497,378 A * | 3/1996 | Amini ............. | G01R 31/31701 714/724 |
| 6,408,413 B1 * | 6/2002 | Whetsel ......... | G01R 31/318555 714/727 |
| 6,829,730 B2 | 12/2004 | Nadeau-Dostie et al. | |
| 6,854,029 B2 * | 2/2005 | Davis .................. | G06F 11/3466 710/100 |
| 6,975,980 B2 | 12/2005 | Whetsel | |
| 7,010,722 B2 | 3/2006 | Jahnke | |
| 7,284,170 B2 | 10/2007 | Whetsel | |
| 7,409,611 B2 * | 8/2008 | Whetsel ......... | G01R 31/318508 714/726 |
| 7,426,670 B2 | 9/2008 | Steinbusch | |
| 7,793,152 B2 | 9/2010 | Swoboda | |
| 7,930,606 B2 | 4/2011 | Machimura et al. | |
| 8,756,467 B2 | 6/2014 | Vaccaro et al. | |
| 9,053,799 B2 * | 6/2015 | Varadarajan ......... | G11C 29/789 |

(Continued)

*Primary Examiner* — Guerrier Merant
(74) *Attorney, Agent, or Firm* — JCIPRNET

(57) ABSTRACT

An electronic system, a system diagnostic circuit, and an operation method thereof are provided. The system diagnostic circuit includes a data register circuit, an instruction register circuit, a diagnostic controller circuit, a control register circuit, and a detect circuit. The diagnostic controller circuit determines to transmit test data to the instruction register circuit or the data register circuit according to an operating state. The detect circuit update the control register circuit when the first test data transmitted to the data register circuit meets a predefined pattern.

18 Claims, 9 Drawing Sheets

(56) References Cited

U.S. PATENT DOCUMENTS

| | | | | |
|---|---|---|---|---|
| 2006/0156106 A1* | 7/2006 | Horie | G01R 31/318555 | 714/724 |
| 2007/0180341 A1* | 8/2007 | Haroun | G01R 31/318555 | 714/727 |
| 2011/0066907 A1* | 3/2011 | Whetsel | G01R 31/318533 | 714/733 |
| 2011/0138238 A1* | 6/2011 | Whetsel | G01R 31/318508 | 714/724 |
| 2012/0126846 A1* | 5/2012 | Jong | G01R 31/318555 | 324/762.03 |
| 2013/0055022 A1* | 2/2013 | Chong | G06F 11/3656 | 714/28 |
| 2013/0238274 A1* | 9/2013 | Danet | G06F 9/22 | 702/123 |
| 2013/0246873 A1* | 9/2013 | Whetsel | G01R 31/318536 | 714/727 |
| 2015/0012786 A1* | 1/2015 | Varadarajan | G11C 29/789 | 714/718 |
| 2015/0082110 A1* | 3/2015 | Whetsel | G01R 31/318508 | 714/727 |

* cited by examiner

ELECTRONIC SYSTEM, SYSTEM DIAGNOSTIC CIRCUIT AND OPERATION METHOD THEREOF

BACKGROUND OF THE INVENTION

Field of the Invention

The invention relates to an electronic system diagnostic technology, and more specifically relates to an electronic system, a system diagnostic circuit, and an operation method.

Description of Related Art

More and more transistors are integrated in a single chip as the complexity of a circuit design growing, it increases the execution time of a scan test for a chip. For example, FIG. 1 is a circuit block diagram depicting a system with Joint Test Action Group (JTAG) standard (or IEEE 1149.1 standard). An electronic system 100 represents a target system that is diagnosed. Diagnostic operations include (but not limit to) debug, performance monitoring, tracing, testing and firmware programming.

The electronic system 100 can include a memory 110 and/or other system devices 120. The electronic system 100 can also include a plurality of processors (such as the processors 130, 140, and 150 shown in FIG. 1). Each of the processors 130, 140, and 150 can access/control the memory 110 and/or the system devices 120 via the system bus 160. Each of the processors 130, 140, and 150 includes a core circuit and a test access port (TAP), as shown in FIG. 1.

The test data output terminal TDO of a diagnosis host 10 is coupled to the test data input terminal TDI of the test access port of the processor 130, the test data output terminal TDO of the test access port of the processor 130 is coupled to the test data input terminal TDI of the test access port of the processor 140, the test data output terminal TDO of the test access port of the processor 140 is coupled to the test data input terminal TDI of the test access port of the processor 150, and the test data output terminal TDO of the test access port of the processor 150 is coupled to the test data input terminal TDI of the diagnosis host 10. Therefore, the coupling relationship between the processors 130, 140, 150 and the diagnosis host 10 is represented as a daisy-chain structure. The processors 130, 140, and 150 form a scan chain.

The diagnosis host 10 outputs a test clock signal TCK, a test mode selection signal TMS, and a reset signal TRST to the test access ports of the processors 130, 140, 150. According to the activation of the test mode selection signal TMS, the test access ports of the processors 130, 140, and 150 can switch operating state. Therefore, the test access ports of the processors 130, 140, and 150 can execute a test instruction that is issued from the diagnosis host 10, and can return a test result to the diagnosis host 10. However, during operation of the system and considering the power management, power supply of one or a plurality of the processors 130, 140, and 150 can be turned off. When power supply of any of the test access ports in the scan chain is turned off, the scan chain is disconnected so that the diagnosis host 10 cannot monitor and/or test the electronic system 100.

SUMMARY OF THE INVENTION

The invention provides an electronic system, a system diagnostic circuit, and an operation method thereof. When the specification of the Joint Test Action Group (JTAG) standard (or the IEEE 1149.1 standard) is met, the system diagnostic circuit can flexibly control the diagnostic operation of the electronic system according to the instruction of the diagnosis host.

An embodiment of the invention provides a system diagnostic circuit of the electronic system. The system diagnostic circuit includes an interface, a data register circuit, an instruction register circuit, a diagnostic controller circuit, a control register circuit, and a detect circuit. The interface is configured to receive a first test data. The data register circuit is an IDCODE register or a bypass register. The diagnostic controller circuit determines to transmit the first test data to the instruction register circuit or the data register circuit according to an operating state. The detect circuit is configured to update the control register circuit when the first test data transmitted to the data register circuit meets a predefined pattern.

An embodiment of the invention provides an electronic system, including a routing circuit, at least one processor circuit, and system diagnostic circuit. The routing circuit is configured to couple to a diagnosis host. The processor circuit includes a core circuit and a processor diagnostic circuit, wherein the processor diagnostic circuit is coupled to the routing circuit. The system diagnostic circuit controls the routing circuit so as to determine a coupling relationship between the system diagnostic circuit, the processor diagnostic circuit, and the diagnosis host. The system diagnostic circuit includes an interface, a data register circuit, an instruction register circuit, a diagnostic controller circuit, a control register circuit, and a detect circuit. The interface is configured to receive a first test data. The data register circuit is an IDCODE register or a bypass register. The diagnostic controller circuit is configured to determine to transmit the first test data to the instruction register circuit or the data register circuit according to an operating state. The detect circuit is configured to update the control register circuit when the first test data transmitted to the data register circuit meets a predefined pattern.

An embodiment of the invention provides an operation method of a system diagnostic circuit. The operation method includes: providing an interface to receive a first test data; providing a data register circuit, wherein the data register circuit is an IDCODE register or a bypass register; providing an instruction register circuit; providing an operation state to determine to transmit the first test data to the instruction register circuit or the data register circuit according to an operating state; and updating the control register circuit by a detect circuit when the first test data transmitted to the data register circuit meets a predefined pattern.

Based on the above, the embodiment of the invention provides an electronic system, a system diagnostic circuit, and an operation method thereof. When the specification of the JTAG standard (or the IEEE 1149.1 standard) is met, the system diagnostic circuit (such as the test access port (TAP)) can flexibly control the diagnostic operation of the electronic system (such as flexibly changing the connecting structure of the diagnosis host with a plurality of test access ports of the electronic system and/or determining whether to enable the access function to the system device in the electronic system) according to the control operation issued from the diagnosis host.

In order to make the aforementioned and other features and advantages of the invention more comprehensible, embodiments accompanying figures are described in detail below.

DESCRIPTION OF THE EMBODIMENTS

Figure 1:
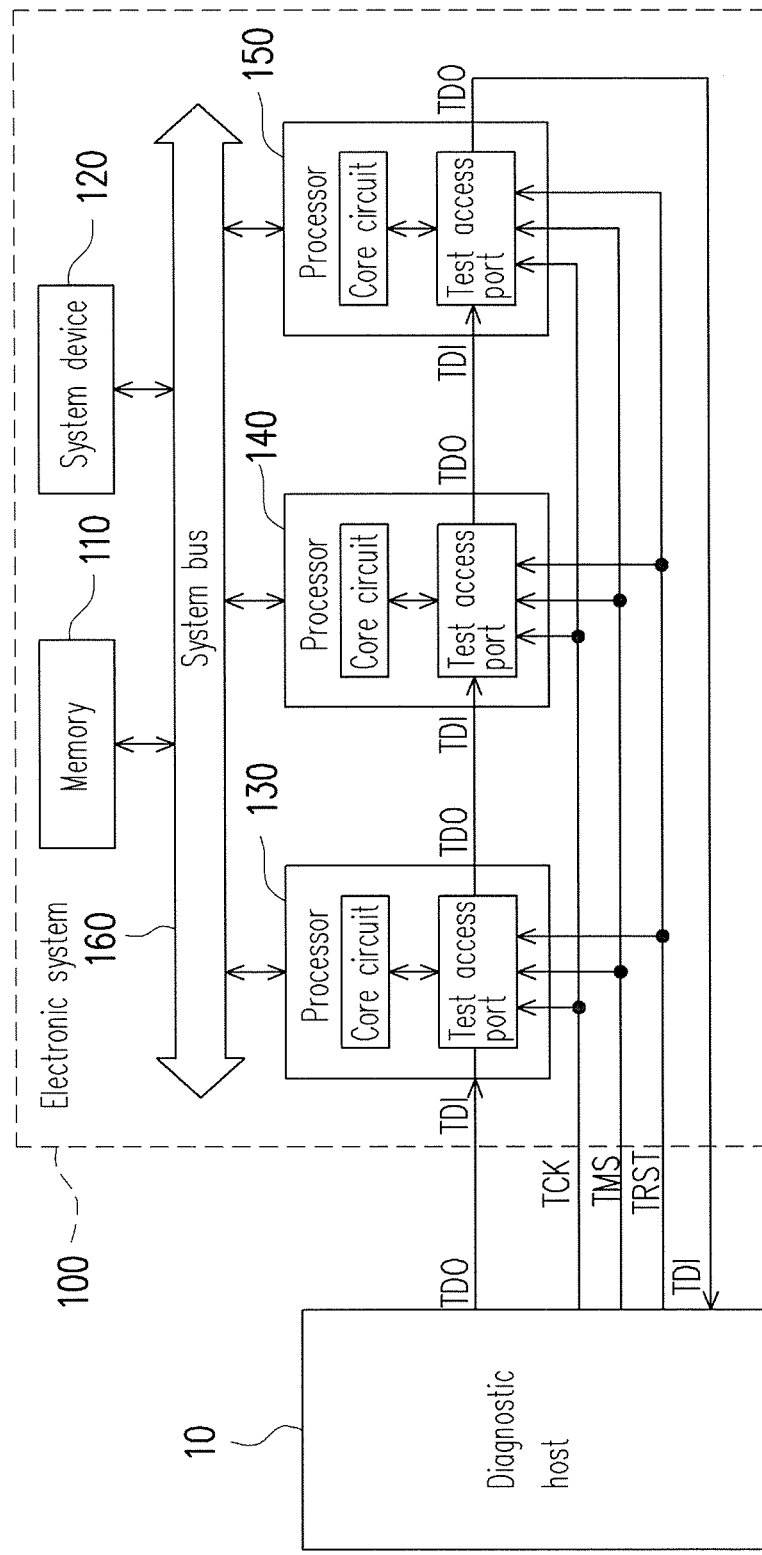
FIG. 1 is a circuit block diagram depicting Joint Test Action Group (JTAG) standard (or IEEE 1149.1 standard).

The term "coupling/coupled" (or connecting/connected) used in this specification (including claims) may refer to any direct or indirect connection means. For example, "a first device is coupled to (or connected to) a second device" should be interpreted as "the first device is directly connected to the second device" or "the first device is indirectly connected to the second device through other devices or connection means". Moreover, wherever appropriate in the drawings and embodiments, elements/devices/steps with the same reference numerals represent the same or similar parts. Elements/devices/steps with the same reference numerals or names in different embodiments may be cross-referenced.

Figure 2:
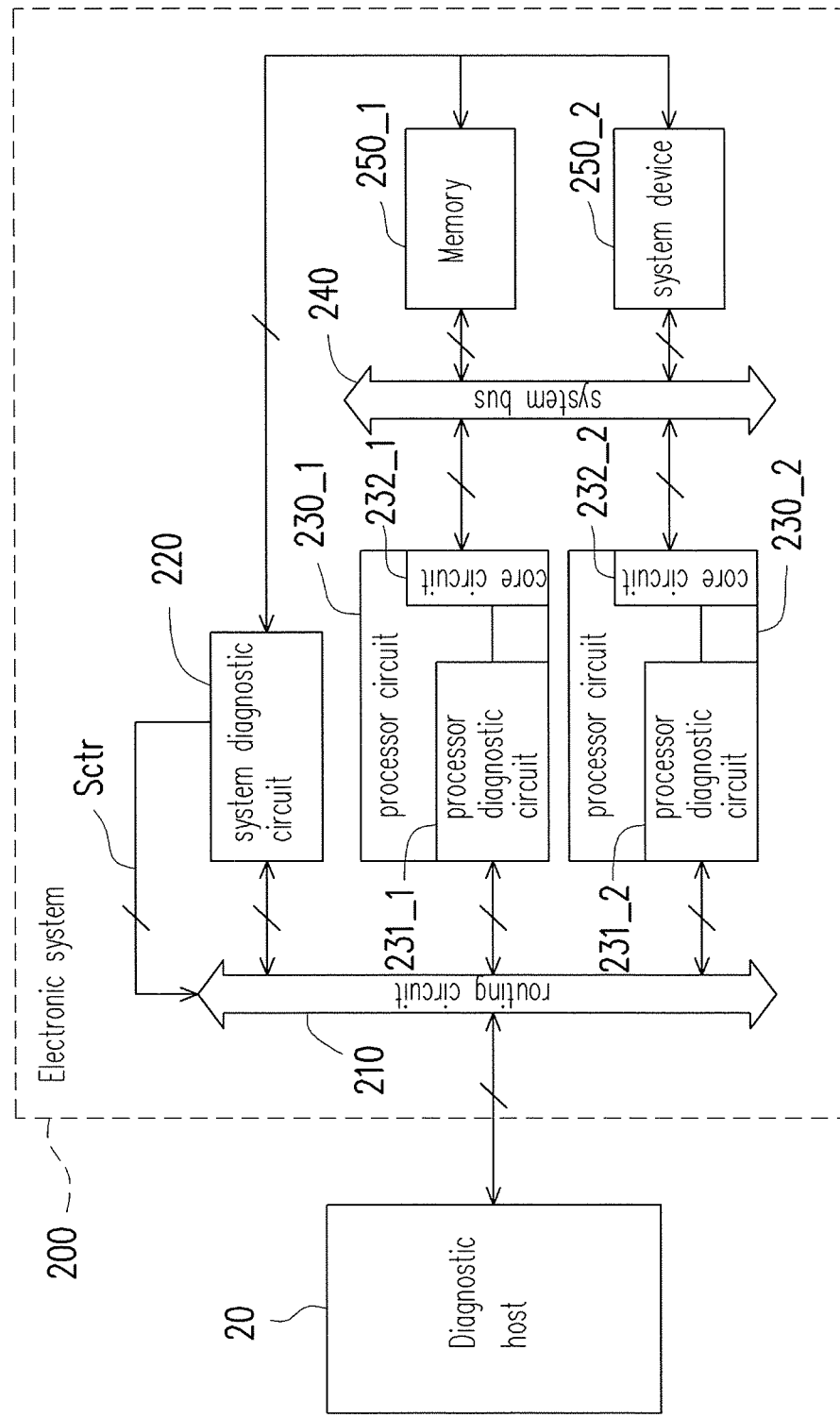
FIG. 2 is a circuit block diagram of an electronic system according to one embodiment of the invention.

FIG. 2 is a circuit block diagram of the electronic system 200 according to one embodiment of the invention. The electronic system 200 includes a routing circuit 210, a system diagnostic circuit 220, at least one processor circuit (such as the processor circuit 230_1 and 230_2 shown in FIG. 2), a system bus 240, and at least one system device (such as the memory 250_1 and another system device 250_2 as shown in FIG. 2). The routing circuit 210 is coupled to a diagnosis host 20. The communication interface between the routing circuit 210 and the diagnosis host 20 can be a communication interface which meets the Joint Test Action Group (herein after JTAG) standard (or the IEEE 1149.1 standard). In other embodiments, the interface can be (but not limited to) IEEE 1149.7 interface, IEEE 5001 interface, Serial Wire Debug (SWD) interface.

The processor circuit 230_1 includes a processor diagnostic circuit 231_1 and a core circuit 232_1. The processor diagnostic circuit 231_1 can meet the Test Access Port (TAP) specification of the JTAG standard (or the IEEE 1149.1 standard), the detail implementation will not be repeated. The processor diagnostic circuit 231_1 is coupled to the routing circuit 210 and the core circuit 232_1. The communication interface between the routing circuit 210 and the processor diagnostic circuit 231_1 can be a communication interface which meets the JTAG standard (or the IEEE 1149.1 standard). The processor circuit 230_2 includes a processor diagnostic circuit 231_2 and a core circuit 232_2. The processor diagnostic circuit 231_2 can meet the Test Access Port (TAP) specification of the JTAG standard (or the IEEE 1149.1 standard), the detail implementation will not be repeated. The processor diagnostic circuit 231_2 is coupled to the routing circuit 210 and the core circuit 232_2. The communication interface between the routing circuit 210 and the processor diagnostic circuit 231_2 can be a communication interface which meets the JTAG standard (or the IEEE 1149.1 standard).

The system diagnostic circuit 220 is coupled to the routing circuit 210. The communication interface between the routing circuit 210 and the system diagnostic circuit 220 can be a communication interface which meets the JTAG standard (or the IEEE 1149.1 standard). The system diagnostic circuit 220 can control the routing circuit 20 so as to determine a coupling relationship between the system diagnostic circuit 220, the processor diagnostic circuit 231_1, the processor diagnostic circuit 231_2, and the diagnosis host 20. For example, based on the control of the system diagnostic circuit 220, the routing circuit 210 can flexibly link the processor diagnostic circuit 231_1 and the processor diagnostic circuit 231_2 to the diagnosis host 20, or can link the processor diagnostic circuit 231_1 and the processor diagnostic circuit 231_2 to the diagnosis host 20 in series so as to form the daisy-chain structure, or can selectively connect one of the system diagnostic circuit 220, the processor diagnostic circuit 231_1 and the processor diagnostic circuit 231_2 to the diagnosis host 20.

The system bus 240 is coupled to the core circuits 232_1 and 232_2. The memory 250_1 and the system device 250_2 is coupled to the system bus 240. Therefore, each of the core circuits 232_1 and 232_2 of the processor circuits 230_1 and 230_2 can access/control the memory 250_1 and/or the system device 250_2 via the system bus 240. Otherwise, the system diagnostic circuit 220 can control the memory 250_1 and/or the system device 250_2 so as to determine whether to enable the access function to the memory 250_1 and/or the system device 250_2.

Figure 3:
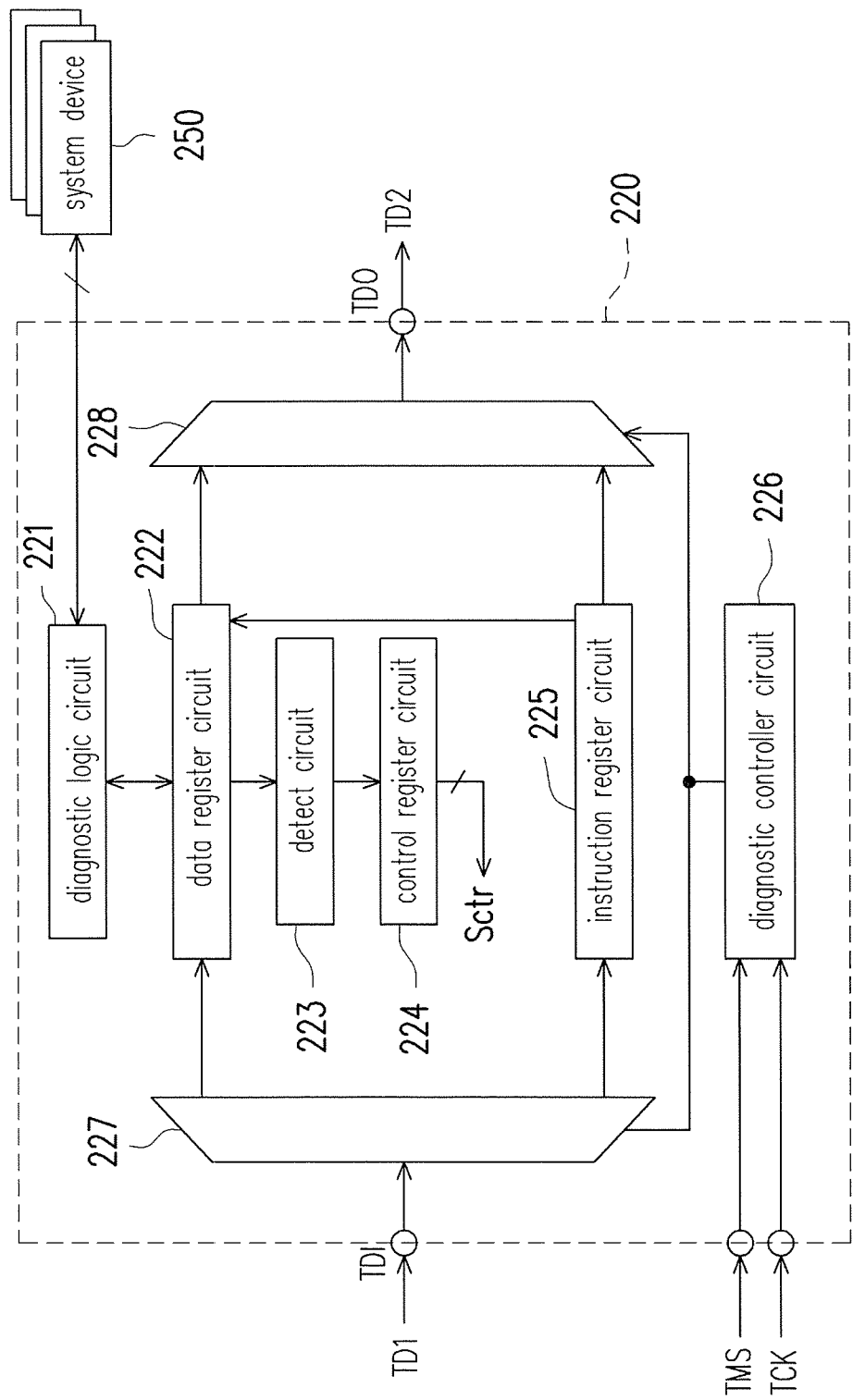
FIG. 3 is a circuit block diagram of a system diagnostic circuit shown in FIG. 2 according to one embodiment of the invention.

FIG. 3 is a circuit block diagram of the system diagnostic circuit 220 shown in FIG. 2 according to one embodiment of the invention. In the embodiment shown in FIG. 3, the system diagnostic circuit 220 includes an interface (e.g. test data input terminal TDI and a test data output terminal TDO), a diagnostic logic circuit 221, a data register circuit 222, a detect circuit 223, a control register circuit 224, an instruction register circuit 225, a diagnostic controller circuit 226, a demultiplexer 227, and a multiplexer 228. The test data input terminal TDI is configured to receive a first test data TD1 from the diagnosis host 20. The input terminal of the demultiplexer 227 is coupled to the test data input terminal TDI to receive the first test data TD1 from the diagnosis host 20. The first output terminal of the demultiplexer 227 is coupled to the data input terminal of the instruction register circuit 225. The second output terminal of the demultiplexer 227 is coupled to the data input terminal of the data register circuit 222. The first input terminal of the multiplexer 228 is coupled to the data output terminal of the instruction register circuit 225. The second input terminal of the multiplexer 228 is coupled to the data output terminal of the data register circuit 222. The output terminal of the multiplexer 228 is coupled to test data output terminal TDO. The test data output terminal TDO is configured to output a second test data TD2. The diagnostic controller circuit 226 can control the demultiplexer 227 and the multiplexer 228. According to the control of the diagnostic controller circuit 226, the instruction register circuit 225 can temporarily store the first test data TD1 outputted from the diagnosis host 20 to serve as a diagnostic instruction, and can execute the diagnostic instruction that is temporarily stored. According to the control of the diagnostic controller circuit 226, the data register circuit 222 can temporarily store the first test data TD1 outputted from the diagnosis host 20. According to the control of the instruction register circuit 225, the diagnostic logic circuit 221 can access a specific register of the data register circuit 222 (which is described later), so as to execute diagnostic operation on the system device 250 (such as the memory 250_1, the system device 250_2 and/or other system devices shown in FIG. 2) of the electronic system 200.

A test mode selection terminal of the system diagnostic circuit 220 is configured to receive the test mode selection signal TMS. The diagnostic controller circuit 226 can sample a test mode selection signal TMS outputted from the diagnosis host 20 according to a test clock signal TCK outputted from the diagnosis host 20, so as to switch operating state of the system diagnostic circuit 220 according to the test mode selection signal TMS. The diagnostic controller circuit 226 is configured to determine to transmit the first test data TD1 of the test data input terminal TDI to the instruction register circuit 225 or the data register circuit 222 according to the operating state. The diagnostic controller circuit 226 is configured to determine to transmit the data outputted from the instruction register circuit 225 or the data register circuit 222 to the test data output terminal TDO to serve as the second test data TD2 according to the operating state.

In some embodiments, the test data input terminal TDI, the test data output terminal TDO, the test mode selection signal TMS, the test clock signal TCK, the diagnostic logic circuit 221, the data register circuit 222, the instruction register circuit 225, the diagnostic controller circuit 226, the demultiplexer 227, and the multiplexer 228 can meet the specification about pin, signal, and circuit of the JTAG standard (or the IEEE 1149.1 standard), and will not be repeated. For example, the operating states of the diagnostic controller circuit 226 may be the operating states that meet the JTAG standard (or the IEEE 1149.1 standard).

Figure 4:
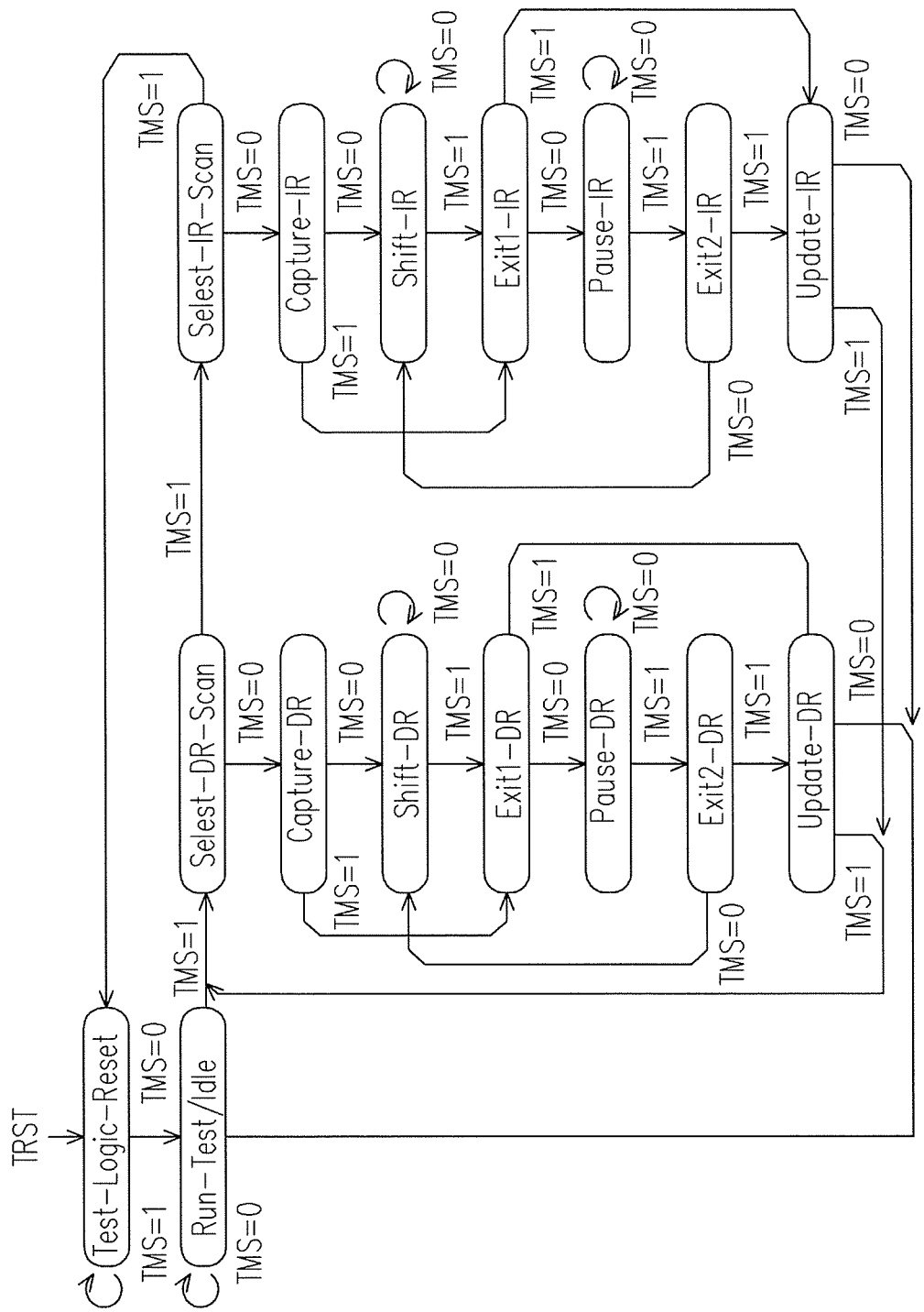
FIG. 4 is a block diagram depicting operating states of Joint Test Action Group (JTAG) standard (or IEEE 1149.1 standard).

FIG. 4 is a block diagram depicting operating state specification of Joint Test Action Group (JTAG) standard (or IEEE 1149.1 standard). Referring to FIG. 2 to FIG. 4, when the diagnosis host 20 outputs a reset signal TRST to the diagnostic controller circuits (such as the diagnostic controller circuit 226) inside the system diagnostic circuit 220, the processor diagnostic circuit 231_1, and the processor diagnostic circuit 231_2 via the routing circuit 210, the diagnostic controller circuits enter a test logic reset state Test-Logic-Reset. According to the test mode selection signal TMS, the test logic reset state Test-Logic-Reset can continue to remain in it's state (the test mode selection signal TMS=1) or can enter a run-test/idle state Run-Test/Idle (the test mode selection signal TMS=0). Subsequently, when the test mode selection signal TMS is logical high (TMS=1), the diagnostic controller circuit 226 enters a select data register scan state Select-DR-Scan from the run-test/idle state Run-Test/Idle. Otherwise, the diagnostic controller circuit 226 continues to remain in the run-test/idle state Run-Test/Idle.

In the select data register scan state Select-DR-Scan, the diagnostic controller circuit 226 can control the demultiplexer 227 to electrically connect the test data input terminal TDI to the data register circuit 222, and can control the multiplexer 228 to electrically connect the data register circuit 222 to the test data output terminal TDO. Subsequently, when the test mode selection signal TMS is logical low (TMS=0), the diagnostic controller circuit 226 enters a capture data register state Capture-DR from the select data register scan state Select-DR-Scan, and the diagnostic controller circuit 226 will provide an enable signal to the data register circuit 222. Subsequently, when the test mode selection signal TMS is logical low, the diagnostic controller circuit 226 enters a shift data register state Shift-DR from the capture data register state Capture-DR, and the diagnostic controller circuit 226 will provide a shifting signal to the data register circuit 222. Otherwise (TMS=1), the diagnostic controller circuit 226 enters an exit 1 data register state Exit1-DR from the capture data register state Capture-DR.

When the diagnostic controller circuit 226 is in the shift data register state Shift-DR, if the test mode selection signal TMS is logical low, the diagnostic controller circuit 226 will continue to remain in the shift data register state Shift-DR. Otherwise (TMS=1), the diagnostic controller circuit 226 enters the exit 1 data register state Exit1-DR from the shift data register state Shift-DR. When the diagnostic controller circuit 226 is in the exit 1 data register state Exit1-DR, if the test mode selection signal TMS is logical low, the diagnostic controller circuit 226 will enter a pause data register state Pause-DR from the exit 1 data register state Exit1-DR. Otherwise (TMS=1), the diagnostic controller circuit 226 enters an update data register state Update-DR from the exit 1 data register state Exit1-DR.

When the diagnostic controller circuit 226 is in the pause data register state Pause-DR, if the test mode selection signal TMS is logical low, the diagnostic controller circuit 226 will continue to remain in the pause data register state Pause-DR. Otherwise (TMS=1), the diagnostic controller circuit 226 enters an exit 2 data register state Exit2-DR from the pause data register state Pause-DR. Subsequently, when the test mode selection signal TMS is low, the diagnostic controller circuit 226 returns to the shift data register state Shift-DR from the exit 2 data register state Exit2-DR. Otherwise (TMS=1), the diagnostic controller circuit 226 enters the update data register state Update-DR from the exit 2 data register state Exit2-DR. Subsequently, when the test mode selection signal TMS is logical low, the diagnostic controller circuit 226 returns to the run-test/idle state Run-Test/Idle from the update data register state Update-DR. Otherwise (TMS=1), the diagnostic controller circuit 226 returns to the select data register scan state Select-DR-Scan from the update data register state Update-DR.

When the diagnostic controller circuit 226 is in the select data register scan state Select-DR-Scan and the test mode selection signal TMS is logical high (TMS=1), the diagnostic controller circuit 226 enters a select instruction register scan state Select-IR-Scan from the select data register scan state Select-DR-Scan.

In the select instruction register scan state Select-IR-Scan, the diagnostic controller circuit 226 can control the demultiplexer 227 to electrically connect the test data input terminal TDI to the instruction register circuit 225, and can control the multiplexer 228 to electrically connect the instruction register circuit 225 to the test data output terminal TDO. Subsequently, when the test mode selection signal TMS is logical high, the diagnostic controller circuit 226 returns to the test logic reset state Test-Logic-Reset from the select instruction register scan state Select-IR-Scan. Conversely, when the test mode selection signal TMS is logical low, the diagnostic controller circuit 226 enters a capture instruction register state Capture-IR from the select instruction register scan state Select-IR-Scan. Subsequently, when the test mode selection signal TMS is logical low, the diagnostic controller circuit 226 enters a shift instruction register state Shift-IR from the capture instruction register state Capture-IR. Otherwise (TMS=1), the diagnostic controller circuit 226 enters an exit 1 instruction register state Exit1-IR from the capture instruction register state Capture-IR.

When the diagnostic controller circuit 226 is in the shift instruction register state Shift-IR, if the test mode selection signal TMS is logical low, the diagnostic controller circuit 226 will continue to remain in the shift instruction register state Shift-IR. Otherwise (TMS=1), the diagnostic controller circuit 226 enters the exit 1 instruction register state Exit1-IR from the shift instruction register state Shift-IR. When the diagnostic controller circuit 226 is in the exit 1 instruction register state Exit1-IR, if the test mode selection signal TMS is logical low, the diagnostic controller circuit 226 will enter a pause instruction register state Pause-IR from the exit 1 instruction register state Exit1-IR. Otherwise (TMS=1), the diagnostic controller circuit 226 enters an update instruction register state Update-IR from the exit 1 instruction register state Exit1-IR.

When the diagnostic controller circuit 226 is in the pause instruction register state Pause-IR, if the test mode selection signal TMS is logical low, the diagnostic controller circuit 226 will continue to remain in the pause instruction register state Pause-IR. Otherwise (TMS=1), the diagnostic controller circuit 226 enters an exit 2-instruction register state Exit2-IR from the pause instruction register state Pause-IR. Subsequently, when the test mode selection signal TMS is logical low, the diagnostic controller circuit 226 returns to the shift instruction register state Shift-IR from the exit 2-instruction register state Exit2-IR. Otherwise (TMS=1), the diagnostic controller circuit 226 enters the update instruction register state Update-IR from the exit 2 instruction register state Exit2-IR. Thereafter, when the test mode selection signal TMS is logical low, the diagnostic controller circuit 226 returns to the run-test/idle state Run-Test/Idle from the update instruction register state Update-IR. Otherwise (TMS=1), the diagnostic controller circuit 226 returns to the select data register scan state Select-DR-Scan from the update instruction register state Update-IR.

Figure 5:
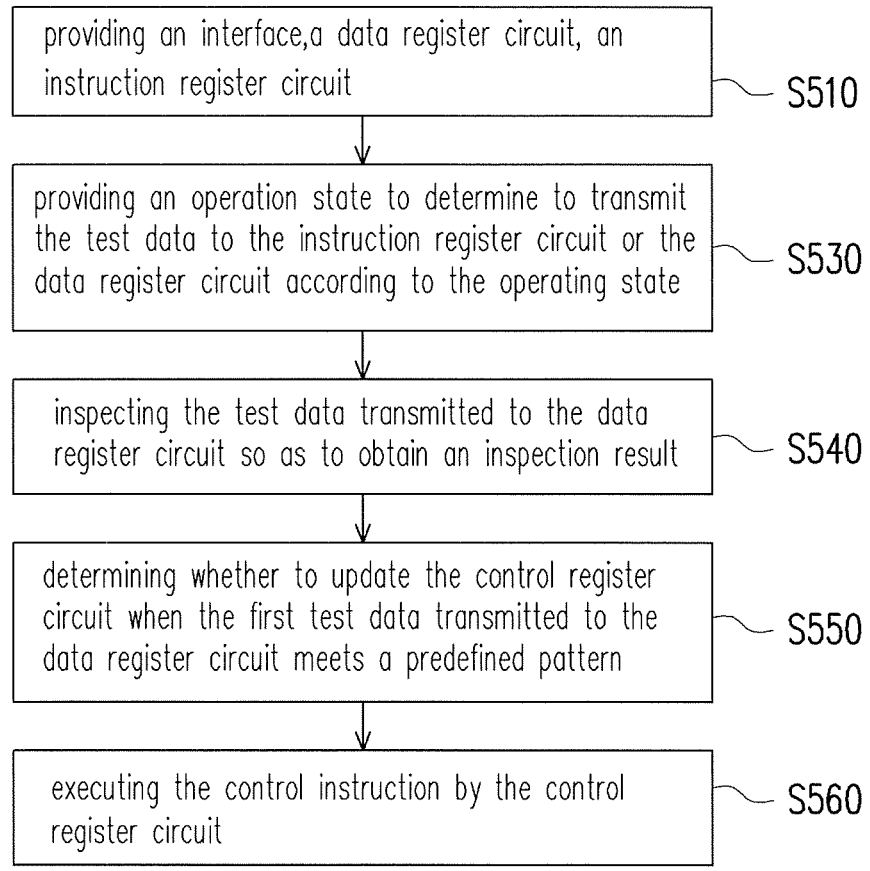
FIG. 5 is a flow diagram of an operation method of a system diagnostic circuit according to one embodiment of the invention.

FIG. 5 is a flow diagram of an operation method of the system diagnostic circuit 220 according to one embodiment of the invention. Referring to FIG. 3 and FIG. 5, Step 510 provides an interface (e.g. the test data input terminal TDI and/or the test data output terminal TDO), the data register circuit 222, and the instruction register circuit 225. In Step S530, an operation state is provided. For example, the diagnostic controller circuit 226 switches operating state of the system diagnostic circuit 220 according to the test mode selection signal TMS, as shown in FIG. 4. According to the operating state of the system diagnostic circuit 226, in Step S530, the system diagnostic circuit 226 can determine to transmit the first test data TD1 of the test data input terminal TDI to the instruction register circuit 225 or the data register circuit 222 according to the operating state. The system diagnostic circuit 226 also can determine to transmit the data outputted from the instruction register circuit 225 or the data register circuit 222 to the test data output terminal TDO to serve as the second test data TD2 according to the operating state.

The input terminal of the detect circuit 223 is coupled to the data register circuit 222 so as to inspect the test data transmitted to the data register circuit 222. The detect circuit 223 inspects the test data transmitted to the data register circuit 222 so as to obtain an inspection result (Step S540). The output terminal of the detect circuit 223 is coupled to the control register circuit 224. The detect circuit 223 can determine whether to update the control register circuit 224 when the test data transmitted to the data register circuit 222 meets a predefined pattern (Step S550). The control register circuit 224 temporarily stores and executes the control operation (Step S560), and control the diagnostic logic circuit 221 and/or the routing circuit 210 according to the control operation issuing at least one control signal Sctr. When the specification of the JTAG standard (or the IEEE 1149.1 standard) is met, the system diagnostic circuit 220 can flexibly control the diagnostic operation of the electronic system 200 according to the control operation issued by the diagnosis host 20. In different test situations, the diagnostic operation to the electronic system 200 is, for example, flexibly changing the connecting structure of the diagnosis host 20 with the system diagnostic circuit 220, the processor diagnostic circuit 231_1, and the processor diagnostic circuit 231_2, and/or determining whether to enable the access function to the system device 250 in the electronic system 200.

Figure 6:
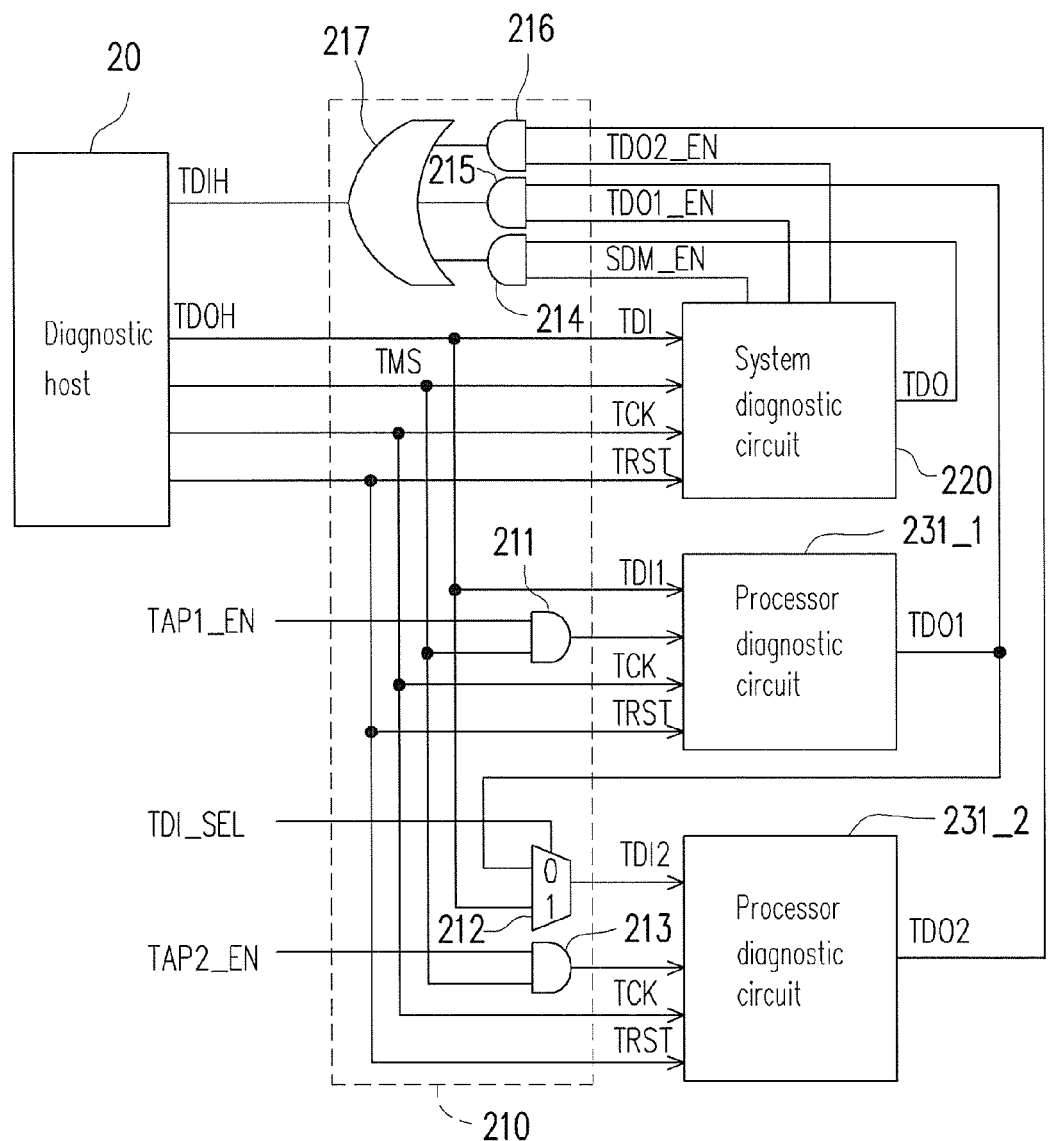
FIG. 6 is a circuit block diagram of a routing circuit shown in FIG. 2 according to one embodiment of the invention.

FIG. 6 is a circuit block diagram of the routing circuit 210 shown in FIG. 2 according to one embodiment of the invention. Two processor diagnostic circuits 231_1 and 231_2 are depicted in the embodiments shown in FIG. 2 and FIG. 6, however the number of the processor diagnostic circuits is corresponding to the number of the processor circuit 230_1 and 230_2 of the diagnosed electronic system 200, and the number of the processor circuits is determined according to design requirements. For instance, in other embodiments, the processor circuit 230_2 and the processor diagnostic circuit 231_2 can be omitted. In another embodiment, the number of the processor circuit and the number of the processor diagnostic circuit in the electronic system 200 can be 3 or more. In the embodiment shown in FIG. 6, the clock input terminals of the system diagnostic circuit 220, the processor diagnostic circuit 231_1 and the processor diagnostic circuit 231_2 are together coupled to the clock output terminal of the diagnosis host 20, so as to receive the test clock signal TCK outputted from the diagnosis host 20. The reset signal input terminals of the system diagnostic circuit 220, the processor diagnostic circuit 231_1 and the processor diagnostic circuit 231_2 are together coupled to the reset signal output terminal of the diagnosis host 20, so as to receive the reset signal TRST outputted from the diagnosis host 20. The test data output terminal TDOH of the diagnosis host 20 is coupled to the test data input terminal TDI of the system diagnostic circuit 220 and the test data input terminal TDI1 of the processor diagnostic circuit 231_1. The test mode selection signal output terminal of the diagnosis host 20 is coupled to the test mode selection signal input terminal the system diagnostic circuit 220, so as to receive the test mode selection signal TMS outputted from the diagnosis host 20.

In the embodiment shown in FIG. 6, the routing circuit 210 includes a first AND gate 211, a multiplexer 212, a second AND gate 213, a third AND gate 214, a fourth AND gate 215, a fifth AND gate 216, and an OR gate 217. The first input terminal of the first AND gate 211 is coupled to the control register circuit 224 of the system diagnostic circuit 220 to receive the first test access port enable signal TAP1_EN of the control signal Sctr. The second input terminal of the first AND gate 211 is configured to couple to the test mode selection signal output terminal of the diagnosis host 20 so as to receive the test mode selection signal TMS. The output terminal of the first AND gate 211 is coupled to the test mode selection signal input terminal of the first processor diagnostic circuit 231_1.

The control terminal of the multiplexer 212 is coupled to the control register circuit 224 of the system diagnostic circuit 220 to receive the data input select signal TDI_SEL of the control signal Sctr. The first input terminal of the multiplexer 212 is coupled to the test data output terminal TDO1 of the first processor diagnostic circuit 231_1. The second input terminal of the multiplexer 212 is configured to couple to the test data output terminal TDOH of the diagnosis host 20 so as to receive the test data. The output terminal of the multiplexer 212 is coupled to the test data input terminal TDI2 of the second processor diagnostic circuit 231_2. The first input terminal of the second AND gate 213 is coupled to the control register circuit 224 of the system diagnostic circuit 220 to receive the second test access port enable signal TAP2_EN of the control signal Sctr. The second input terminal of the second AND gate 213 is configured to couple to the test mode selection signal output terminal of the diagnosis host 20 so as to receive the test mode selection signal TMS. The output terminal of the second AND gate 213 is coupled to the test mode selection signal input terminal of the second processor diagnostic circuit 231_2.

The first input terminal of the third AND gate 214 is coupled to the control register circuit 224 of the system diagnostic circuit 220 to receive the system diagnostics module enable signal SDM_EN of the control signal Sctr. The second input terminal of the third AND gate 214 is coupled to the test data output terminal TDO of the system diagnostic circuit 220. The first input terminal of the fourth AND gate 215 is coupled to the control register circuit 224 of the system diagnostic circuit 220 to receive the first output enable signal TDO1_EN of the control signal Sctr. The second input terminal of the fourth AND gate 215 is coupled to the test data output terminal TDO1 of the first processor diagnostic circuit 231_1. The first input terminal of the fifth AND gate 216 is coupled to the control register circuit 224 of the system diagnostic circuit 220 to receive the second output enable signal TDO2_EN of the control signal Sctr. The second input terminal of the fifth AND gate 216 is coupled to the test data output terminal TDO2 of the second processor diagnostic circuit 231_2. The first input terminal of the OR gate 217 is coupled to the output terminal of the third AND gate 214. The second input terminal of the OR gate 217 is coupled to the output terminal of the fourth AND gate 215. The third input terminal of the OR gate 217 is coupled to the output terminal of the fifth AND gate 216. The output terminal of the OR gate 217 is configured to couple to the test data input terminal TDIH of the diagnosis host 20.

TDI_SEL, the first output enable signal TDO1_EN, the second output enable signal TDO2_EN, and the system diagnostics module enable signal SDM_EN of the control signal Sctr. When the specification of the JTAG standard (or the IEEE 1149.1 standard) is met, the diagnosis host 20 can control the diagnostic controller circuit 226 to enter the shift data register state Shift-DR so as to shift the test data (the control command to the control register circuit 224) to enter the data register circuit 222. The detect circuit 223 can inspect the test data transmitted to the data register circuit 222. When the detect circuit 223 determines the test data transmitted to the data register circuit 222 is the control command to the control register circuit 224 (the detail of determining mechanism will be described later), the detect circuit 223 can update the control register circuit 224 with the test data transmitted to the data register circuit 222 to serve as the control operation. According to the control operation issued by the diagnosis host 20, the control register circuit 224 can correspondingly issue the control signal Sctr (containing TAP1_EN, TAP2_EN, TDI_SEL, TDO1_EN, TDO2_EN, and SDM_EN as shown in Table 1), so as to flexibly change the connecting structure of the diagnosis host 20 with the system diagnostic circuit 220, the processor diagnostic circuit 231_1, and the processor diagnostic circuit 231_2 via controlling the routing circuit 210.

For example, when TAP1_EN=logic 1, TAP2_EN=logic 1, TDI_SEL=logic 0, TDO1_EN=logic 0, TDO2_EN=logic 1, and SDM_EN=logic 0, the connecting structure of the diagnosis host 20 with the system diagnostic circuit 220, the processor diagnostic circuit 231_1, and the processor diagnostic circuit 231_2 is daisy-chain structure. When TAP1_EN=logic 1, TAP2_EN=logic 0, TDI_SEL=logic 1, TDO1_EN=logic 1, TDO2_EN=logic 0, and SDM_EN logic 0, the test data input terminal TDI1 and the test data output terminal TDO1 of the processor diagnostic circuit 231_1 are connected to the diagnosis host 20, and the test data input terminal and the test data output terminal of the processor diagnostic circuit 231_2 and the system diagnostic circuit 220 are not connected to the diagnosis host 20. When TAP1_EN=logic 0, TAP2_EN=logic 1, TDI_SEL=logic 1, TDO1_EN=logic 0, TDO2_EN=logic 1, and SDM_EN=logic 0, the test data input terminal TDI2 and the test data output terminal TDO2 of the processor diagnostic circuit 231_2 are connected to the diagnosis host 20, and the test data input terminal and the test data output terminal of the processor diagnostic circuit 231_1 and the system diag-

TABLE 1

The control signal Sctr of the control register circuit 224 of the system diagnostic circuit 220

| The connection to the diagnosis host 20. | TAP1_EN | TAP2_EN | TDI_SEL | TDO1_EN | TDO2_EN | SDM_EN |
|---|---|---|---|---|---|---|
| daisy-chain | 1 | 1 | 0 | 0 | 1 | 0 |
| processor diagnostic circuit 231_1 | 1 | 0 | 1 | 1 | 0 | 0 |
| processor diagnostic circuit 231_2 | 0 | 1 | 1 | 0 | 1 | 0 |
| system diagnostic circuit 220 | 0 | 0 | 1 | 0 | 0 | 1 |
| processor diagnostic circuit 231_1 and processor diagnostic circuit 231_2 | 1 | 1 | 1 | 1 | 1 | 0 |

The Table 1 is a truth table explaining the first test access port enable signal TAP1_EN, the second test access port enable signal TAP2_EN, the data input selection signal nostic circuit 220 are not connected to the diagnosis host 20. When TAP1_EN=logic 0, TAP2_EN=logic 0, TDI_SEL=logic 1, TDO1_EN=logic 0, TDO2_EN=logic 0, and SDM_EN=logic 1, the test data input terminal TDI and the test data output terminal TDO of the system diagnostic circuit 220 are connected to the diagnosis host 20, and the test data input terminal and the test data output terminal of the processor diagnostic circuit 231_2 and the processor diagnostic circuit 231_1 are not connected to the diagnosis host 20. When TAP1_EN=logic 1, TAP2_EN=logic 1, TDI_SEL=logic 1, TDO1_EN=logic 1, TDO2_EN=logic 1, and SDM_EN=logic 0, the test data input terminal TDI1 of the processor diagnostic circuit 231_1 and the test data input terminal TDI2 of the processor diagnostic circuit 231_2 are together connected to the test data output terminal TDOH of the diagnosis host 20, and the test data output terminal TDO1 of the processor diagnostic circuit 231_1 and the test data output terminal TDO2 of the processor diagnostic circuit 231_2 are together connected to the diagnosis host 20.

Therefore, the system diagnostic circuit 220 can flexibly control the diagnostic operation of the electronic system 200 according to the control operation issued from the diagnosis host 20. According to different test situations, the connecting structure of the diagnosis host 20 with the system diagnostic circuit 220, the processor diagnostic circuit 231_1, and the processor diagnostic circuit 231_2 can be flexibly changed.

Figure 7:
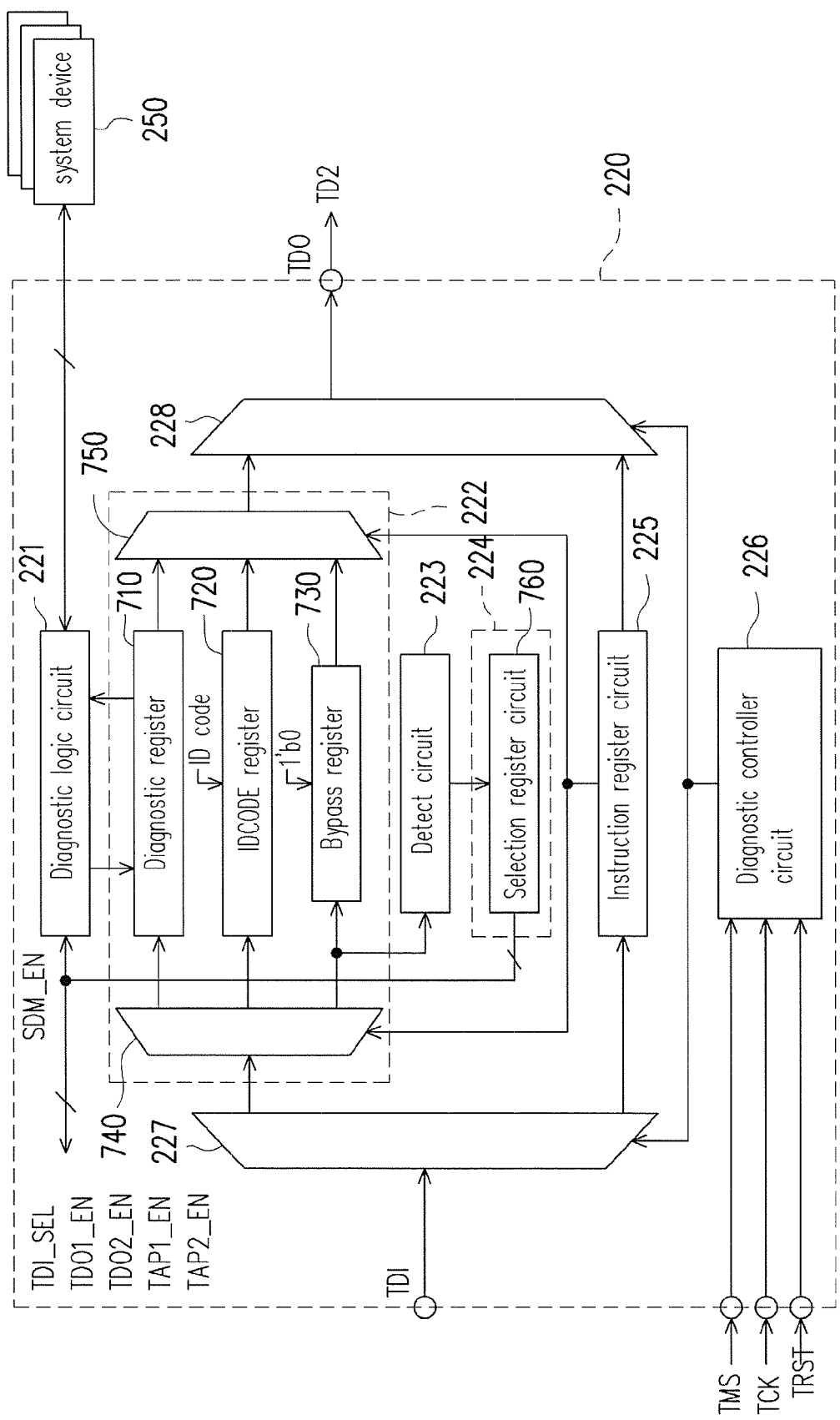
FIG. 7 is a circuit block diagram of a data register circuit and a control register circuit shown in FIG. 3 according to one embodiment of the invention.

FIG. 7 is a circuit block diagram of the data register circuit 222 and the control register circuit 224 shown in FIG. 3 according to one embodiment of the invention. In the embodiment shown in FIG. 7, the data register circuit 222 includes a diagnostic register 710, an identification code (IDCODE) register 720, a bypass register 730, a bypass register 730, a demultiplexer 740, and a multiplexer 750, and the control register circuit 224 includes a selection register circuit 760. When diagnostic controller circuit 226 enters a capture data register state Capture-DR, the IDCODE register 720 is updated as a 32-bit predetermined value ID code. When diagnostic controller circuit 226 enters a capture data register state Capture-DR, the bypass register 730 is updated as 1-bit value 0. In other embodiments (but not limit to), the diagnostic register 710, the IDCODE register 720, and/or the bypass register 730 may be the registers that meet the JTAG standard or other standard, and therefore will not be repeated.

The input terminal of the demultiplexer 740 is coupled to the second output terminal of the demultiplexer 227. The control terminal of the demultiplexer 740 is controlled by the instruction register circuit 225. The first output terminal of the demultiplexer 740 is coupled to the data input terminal of the diagnostic register 710. The second output terminal of the demultiplexer 740 is coupled to the data input terminal of the IDCODE register 720. The third output terminal of the demultiplexer 740 is coupled to the data input terminal of the bypass register 730. The first input terminal of the multiplexer 750 is coupled to the data output terminal of the diagnostic register 710. The second input terminal of the multiplexer 750 is coupled to the data output terminal of the IDCODE register 720. The third input terminal of the multiplexer 750 is coupled to the data output terminal of the bypass register 730. The control terminal of the multiplexer 750 is controlled by the instruction register circuit 225. The output terminal of the multiplexer 750 is coupled to the second input terminal of the multiplexer 228. The data register circuit 222 and the instruction register circuit 225 can accord with the JTAG standard and will not be repeated.

The detect circuit 223 can inspect the test data transmitted to specific registers in the data register circuit 222. For example, the detect circuit 223 can inspect the test data transmitted to "the registers that do not affect the electronic system" in the data register circuit 222. The part "registers that do not affect the electronic system" means that after the diagnosis host 20 transmits data to "the registers that do not affect the electronic system" of the data register circuit 222, it does not affect the content of other registers of the electronic system. For example (but not limit to), the IDCODE register 720 and the bypass register 730 can be "registers that do not affect the electronic system". In other embodiments, the detect circuit 223 can detect the test data transmitted to the IDCODE register 720. When the detect circuit 223 determines the test data transmitted to the IDCODE register 720 is the control command to the control register circuit 224, the detect circuit 223 can update the control register circuit 224 with the test data transmitted to the IDCODE register 720 to serve as the control operation. In the embodiments shown in FIG. 7, the detect circuit 223 can detect the test data transmitted to the bypass register 730. When the detect circuit 223 determines the test data transmitted to the bypass register 730 is the control command to the control register circuit 224, the detect circuit 223 can update the control register circuit 224 with the test data transmitted to the bypass register 730 to serve as the control operation.

Several examples of the inspection mechanism of the detect circuit 223 are described as following.

In some embodiments, the detect circuit 223 has a predefined pattern, and the predefined pattern can be freely determined according to design requirements. For example, the predefined pattern can be 0x801 or other values. When the test data transmitted to the data register circuit 222 (such as bypass register 730) meets the predefined pattern, the detect circuit 223 can update the control register circuit 224 with a part or the whole of the test data transmitted to the bypass register 730 to serve as the control operation.

In other embodiments, the detect circuit 223 has a predefined pattern, and the predefined pattern includes a predefined preamble, the predefined preamble can be freely determined according to design requirements. For example, the predefined preamble can be 0x801 or other values. The test data transmitted to the data register circuit 222 (such as the bypass register 730) comprises a preamble part and a data part. The location of and preamble part can be freely determined according to design requirements. When the preamble part of the test data matches the predefined preamble, the test data transmitted to the bypass register 730 is determined as meeting the predefined pattern. When the test data transmitted to the bypass register 730 meets the predefined pattern, the detect circuit 223 can update the control register circuit 224 with the data part of the test data transmitted to the bypass register 730 to serve as the control operation.

In other embodiments, the detect circuit 223 has a predefined pattern, and the predefined pattern includes a predefined preamble, the predefined preamble can be freely determined according to design requirements. For example, the predefined preamble can be 0x801 or other values. The test data transmitted to the data register circuit 222 (such as the bypass register 730) comprises a preamble part, a data part, and an error checking code. When the preamble part of the test data matches the predefined preamble and a calculation result obtained from calculating the test data by an error checking calculation matches the error checking code, the test data transmitted to the bypass register 730 is determined as meeting the predefined pattern. The error checking calculation can be any error checking algorithm, such as checksum algorithm, cyclic redundancy check (CRC) algorithm, MD5 algorithm, SHA algorithm, error-correction algorithm, etc. When the test data transmitted to the bypass register 730 meets the predefined pattern, the detect circuit 223 can update the control register circuit 224 with the data part of the test data transmitted to the bypass register 730 to serve as the control operation.

In other embodiments, the detect circuit 223 has a predefined pattern, and the predefined pattern includes a predefined preamble and a predefined address, the predefined preamble and the predefined address can be freely determined according to design requirements. The test data transmitted to the data register circuit 222 (such as the bypass register 730) includes a preamble part, an address part, a data part, and an error checking code. When the preamble part matches the predefined preamble and the address part of the test data matches the predefined address and a calculation result obtained from calculating the address part and the data part by an error checking calculation matches the error checking code, the test data transmitted to the bypass register 730 is determined as meeting the predefined pattern. The error checking calculation can be any error checking algorithm, such as checksum algorithm, cyclic redundancy check (CRC) algorithm, MD5 algorithm, SHA algorithm, error-correction algorithm, etc. When the test data transmitted to the bypass register 730 meets the predefined pattern, the detect circuit 223 can update the control register circuit 224 with the address part and the data part of the test data transmitted to the bypass register 730 to serve as the control operation.

In other embodiments, the detect circuit 223 can further inspect the transformation sequence of the operating state of the system diagnostic circuit 220. In addition, the detect circuit 223 obtains the inspection result according to the transformation sequence of the operating state and the test data transmitted to the data register circuit 222 (such as the bypass register 730). For example, when the test data transmitted to the bypass register 730 meets the predefined pattern and the transformation sequence of the operating state of the diagnostic controller circuit 226 meets a certain predefined sequence, the detect circuit 223 can update the control register circuit 224 with a part or the whole of the test data transmitted to the bypass register 730 to serve as the control operation. The certain predefined sequence can be freely determined according to design requirements. For example, when the transformation sequence of the operating state of the diagnostic controller circuit 226 includes the shift data register state Shift-DR, it can be considered that the transformation sequence of the operating state of the diagnostic controller circuit 226 meets the certain predefined sequence. For example, when the transformation sequence of the operating state of the diagnostic controller circuit 226 includes the shift data register state Shift-DR and the pause data register state Pause-DR, it can be considered that the transformation sequence of the operating state of the diagnostic controller circuit 226 meets the certain predefined sequence. For example, when the transformation sequence of the operating state of the diagnostic controller circuit 226 includes "the states Capture-DR, Shift-DR, Exit1-DR, Update-DR", or includes "the states Capture-DR, Shift-DR, Exit1-DR, Pause-DR, Exit2-DR, Update-DR", or includes "states Capture-DR, Exit1-DR, Pause-DR, Exit2-DR, Shift-DR, Exit1-DR, Update-DR", it can be considered that the transformation sequence of the operating state of the diagnostic controller circuit 226 meets the certain predefined sequence.

In other embodiments, the detect circuit 223 can further detect whether the diagnostic instruction of the instruction register circuit 225 uses the IDCODE register 720 or the bypass register 730. For example, when the test data transmitted to the data register circuit 222 (such as the bypass register 730) meets the predefined pattern and the transformation sequence of the operating state of the diagnostic controller circuit 226 meets the predefined sequence and the diagnostic instruction of the instruction register circuit 225 uses the bypass register 730, the detect circuit 223 can update the control register circuit 224 with a part or the whole of the test data transmitted to the bypass register 730 to serve as the control operation. Otherwise, in other embodiments, when the test data transmitted to the IDCODE register 720 meets the predefined pattern and the transformation sequence of the operating state of the diagnostic controller circuit 226 meets the predefined sequence and the diagnostic instruction of the instruction register circuit 225 uses the IDCODE register 720, the detect circuit 223 can update the control register circuit 224 with a part or the whole of the test data transmitted to the IDCODE register 720 to serve as the control operation.

In the embodiment shown in FIG. 7, the control register circuit 224 includes a selection register circuit 760. The input terminal of the selection register circuit 760 is coupled to the output terminal of the detect circuit 223 to receive a part or the whole of the test data transmitted to the data register circuit 222 (such as the bypass register 730) to serve as a select operation. According to the select operation, the selection register circuit 760 can determine a coupling mode, wherein the coupling mode defines the coupling relationship between other diagnostic circuits (such as the processor diagnostic circuit 231_1 and 231_2) of the electronic system 200 and the diagnosis host 20. In some exemplary applications, the coupling mode may be inferred with reference to related description for Table. 1.

In some embodiments, when the coupling mode represents the coupling relationship between the other diagnostic circuits and the diagnosis host 20 as a daisy-chain structure, the detect circuit 223 can inspect whether the diagnostic instruction of the instruction register circuit 225 uses the IDCODE register 720 or the bypass register 730 meeting JTAG standard and can inspect whether the diagnostic instruction of the instruction register circuit of other diagnostic circuits (such as the processor diagnostic circuits 231_1 and 231_2) uses the IDCODE register or the bypass register meeting JTAG standard. When the test data transmitted to the data register circuit 222 (such as the IDCODE register 720 or the bypass register 730) meets the certain predefined pattern and the transformation sequence of the operating state of the diagnostic controller circuit 226 meets a certain predefined sequence and the diagnostic instruction of the instruction register circuit 225 of the system diagnostic circuit 220 uses the IDCODE register 720 or the bypass register 730 and the diagnostic instruction of the instruction register circuit of other diagnostic circuits (such as the processor diagnostic circuits 231_1 and 231_2) uses the IDCODE register or the bypass register, the detect circuit 223 updates the control register circuit 224 with a part or the whole of the test data transmitted to the data register circuit 222 (such as the IDCODE register 720 or the bypass register 730) to serve as the control operation.

Figure 8:
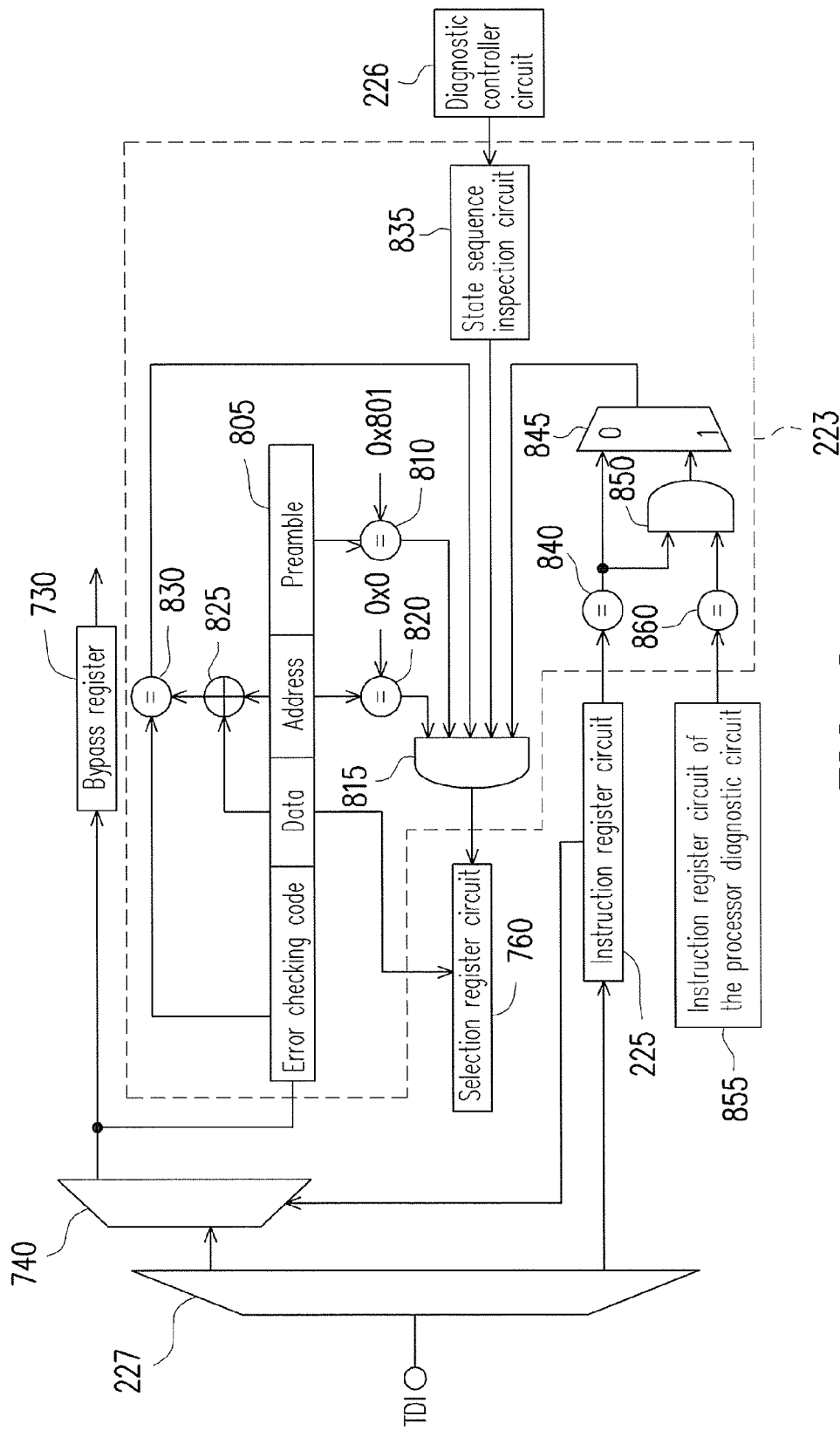
FIG. 8 is a circuit block diagram of a detect circuit shown in FIG. 7 according to one embodiment of the invention.

For example (but not limited to), FIG. 8 is a circuit block diagram of the detect circuit 223 shown in FIG. 7 according to one embodiment of the invention. When the instruction register circuit 225 selects to couple the bypass register 730 to the demultiplexer 227, the test data of the test data input terminal TDI can be transmitted to the bypass register 730 via the demultiplexer 227 and the demultiplexer 740. The test data 805 shown in FIG. 8 can represent the test data transmitted to the bypass register 730. The test data 805 includes a preamble part, an address part, a data part, and an error checking code, as shown in FIG. 8. The inspection circuit 810 can inspect whether the preamble part of the test data 805 matches the predefined preamble (such as 0x801), and can transmit the inspection result to the AND gate 815. The inspection circuit 820 can inspect whether the address part of the test data 805 matches the predefined address (such as 0x0), and can transmit the inspection result to the AND gate 815. The inspection circuit 820 can inspect whether the address part of the test data 805 matches the predefined address (such as 0x0), and can transmit the inspection result to the AND gate 815.

The exclusive-OR (XOR) operating circuit 825 can perform the exclusive-OR operation on the address part and the data part of the test data 805, and can transmit the operating result to the inspection circuit 830. For example, hypothetically, the address part of the test data 805 has 8 bits and can be represented by addr[7:0], and the data part of the test data 805 has 32 bits and can be represented by data[31:0]. The exclusive-OR operating circuit 825 can transmit the operating result of addr[7:0]⊕data[31:24]⊕data[23:16]⊕data[15:8]⊕data[7:0] to the inspection circuit 830. The inspection circuit 830 can inspect whether the operating result of the exclusive-OR operating circuit 825 matches the error checking code of the test data 805, and can transmit the inspection result to the AND gate 815.

The state sequence inspection circuit 835 can inspect whether the operating state of the diagnostic controller circuit 226 matches the certain predefined sequence, and can transmit the inspection result to the AND gate 815. The inspection circuit 840 can detect whether the data registers selected by the instruction register circuit 225 are the "registers do not affect the electronic system" (such as the bypass register 730), and can transmit the inspection result to the first input terminal of the multiplexer 845 and the first input terminal of the AND gate 815. The output terminal of the AND gate 850 is coupled to the second input terminal of the multiplexer 845. The output terminal of the multiplexer 845 is coupled to the AND gate 815, as shown in FIG. 8. The instruction register circuit 855 shown in FIG. 8 represents another instruction register circuit of the electronic system 200, such as the processor diagnostic circuit 231_1 and 231_2 shown in FIG. 2 and FIG. 6. The inspection circuit 860 can detect whether the data registers selected by the instruction register circuit 855 are the "registers do not affect the electronic system" (such as the bypass register), and can transmit the inspection result to the second input terminal of the AND gate 850. The output terminal of the AND gate 815 is coupled to the control terminal of the selection register circuit 760 of the control register circuit 224.

Hypothetically, the test data input terminal TDI and the test data output terminal TDO of the system diagnostic circuit 220 are connected to the diagnosis host 20, and the test data input terminal and the test data output terminal of the processor diagnostic circuit 231_2 and the processor diagnostic circuit 231_1 are not connected to the diagnosis host 20, and therefore the multiplexer 845 selects to electrically connect the output terminal of the inspection circuit 840 to the AND gate 815. Therefore, when the preamble part of the test data 805 matches the predefined preamble and the address part of the test data 805 matches the predefined address and the calculation result obtained from calculating the address part and the data part of the test data 805 by the error checking calculation matches the error checking code of the test data 805 and the transformation sequence of the operating state of the diagnostic controller circuit 226 meets the certain predefined sequence and the data register selected by the instruction register circuit 225 is the bypass register 730, the AND gate 815 can active/control the selection register circuit 760, so as to update the selection register circuit 760 with the data part of the test data (the test data 805) transmitted to the bypass register 730 to serve as the control operation.

Hypothetically, the connecting structure of the diagnosis host 20 with the system diagnostic circuit 220, the processor diagnostic circuit 231_1, and the processor diagnostic circuit 231_2 is daisy-chain structure, and therefore the multiplexer 845 selects to electrically connect the output terminal of the AND gate 850 to the AND gate 815. Therefore, when the preamble part of the test data 805 matches the predefined preamble and the address part of the test data 805 matches the predefined address and the calculation result obtained from calculating the address part and the data part of the test data 805 by the error checking calculation matches the error checking code of the test data 805 and the transformation sequence of the operating state of the diagnostic controller circuit 226 meets the certain predefined sequence and the data register selected by the instruction register circuit in the electronic system 100 is the bypass register, the AND gate 815 can active/control the selection register circuit 760, so as to update the selection register circuit 760 with the data part of the test data (the test data 805) transmitted to the bypass register 730 to serve as the control operation.

Figure 9:
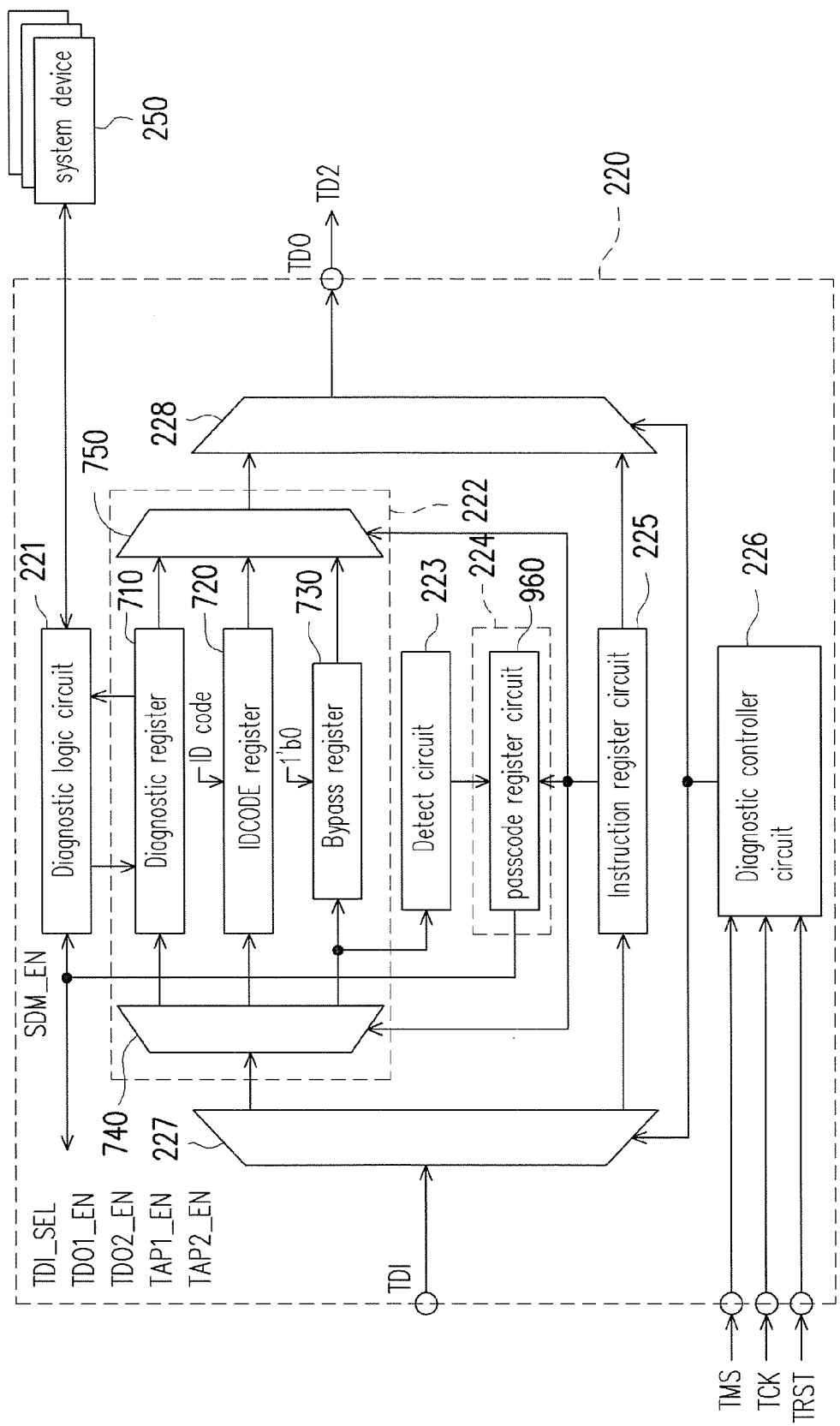
FIG. 9 is a circuit block diagram of the data register circuit and the control register circuit shown in FIG. 3 according to another embodiment of the invention.

FIG. 9 is a circuit block diagram of the data register circuit 222 and the control register circuit 224 shown in FIG. 3 according to another embodiment of the invention. The embodiment shown in FIG. 9 may be inferred with reference to related description for FIG. 7, the similar part will not be repeated. In the embodiment shown in FIG. 9, the control register circuit 224 includes a passcode register circuit 960. The input terminal of the passcode register circuit 960 is coupled to the output terminal of the detect circuit 223 to receive a part or the whole of the test data transmitted to the data register circuit 222 (such as the bypass register 730) to serve as a passcode. The detect circuit 223 can update the passcode register circuit 960 with a part or the whole of the test data transmitted to the bypass register 730 according to the inspection result (the detail description is mentioned in the description of the above embodiment and will not be repeated). According to the passcode, the passcode register circuit 960 can determine whether to enable an access function of the diagnostic logic circuit 221 of the system diagnostic circuit 220 for accessing the system device 250 of the electronic system 200.

When the specification of the JTAG standard (or the IEEE 1149.1 standard) is met, the system diagnostic circuit 220 shown in FIG. 9 can flexibly control the diagnostic operation of the electronic system (such as determining whether to enable the access function to the system device in the electronic system) according to the control operation issued from the diagnosis host 20. Therefore, an unauthorized machine cannot read data of the system device 250 (such as the memory) (because the unauthorized machine cannot know the correct passcode).

It should be noticed here, in different test situations, the related functions of the routing circuit 210, the diagnostic logic circuit 221, the data register circuit 222, the detect circuit 223, the control register circuit 224, the instruction register circuit 225, and/or the diagnostic controller circuit 226 can use the hardware description languages (such as Verilog HDL or VHDL) or other appropriate programming languages to actualize as firmware or hardware. The firmware executing the related functions can be arranged as any known computer-accessible media, such as magnetic tape, semiconductor memory, magnetic disk or compact disk (such as CD-ROM or DVD-ROM), or the firmware can be transmitted via Internet, wired communication, wireless communication, or other communication medias. The firmware can be stored in the accessible media of the computer, so that the controller or the processor of the computer can access/execute the programming codes of the firmware. In addition, the device and the method of the invention can be achieved by combining hardware and software.

In summary, the embodiments provide the electronic system 200, the system diagnostic circuit 220, and the operation method thereof. With regard to the JTAG standard (or the IEEE 1149.1 standard), the control register circuit 224 is an addition circuit. When the specification of the JTAG standard (or the IEEE 1149.1 standard) is met, the diagnosis host 20 can issue the control operation to the control register circuit 224 of the system diagnostic circuit 220. The system diagnostic circuit 220 can flexibly control the diagnostic operation of the electronic system 200 according to the control operation outputted from the diagnosis host 20, such as flexibly changing the connecting structure of the diagnosis host 20 with a plurality of test access ports of the electronic system 200 (such as the system diagnostic circuit 220, the processor diagnostic circuit 231_1, and the processor diagnostic circuit 231_2), and/or determining whether to enable the access function to the system device 250 in the electronic system 200.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A system diagnostic circuit of an electronic system, comprising:
    an interface, configured to receive a first test data;
    a data register circuit, wherein the data register circuit is an IDCODE register or a bypass register;
    an instruction register circuit;
    a diagnostic controller circuit, configured to determine to transmit the first test data to the instruction register circuit or the data register circuit according to an operating state;
    a control register circuit; and
    a detect circuit, configured to update the control register circuit when the first test data transmitted to the data register circuit meets a predefined pattern, wherein the predefined pattern comprises a predefined preamble, and the first test data transmitted to the data register circuit comprises a preamble part, a data part, and an error checking code, and
    when the preamble part matches the predefined preamble and a calculation result obtained from calculating the first test data by an error checking calculation matches the error checking code, the first test data transmitted to the data register circuit is determined as meeting the predefined pattern.

2. The system diagnostic circuit of the electronic system as recited in claim 1, wherein the interface comprising:
    a test data input terminal, configured to receive the first test data;
    a test data output terminal, configured to output a second test data; and
    a test mode selection terminal, configured to receive a test mode selection signal.

3. The system diagnostic circuit of the electronic system as recited in claim 1, wherein the predefined pattern comprises a predefined preamble, and the first test data transmitted to the data register circuit comprises a preamble part and a data part, when the preamble part matches the predefined preamble, the first test data transmitted to the data register circuit is determined as meeting the predefined pattern.

4. The system diagnostic circuit of the electronic system as recited in claim 1, wherein the detect circuit further inspects a transformation sequence of the operating state of the system diagnostic circuit, and obtains an inspection result according to the transformation sequence of the operating state and the first test data transmitted to the data register circuit; and
    wherein the detect circuit updates the control register circuit when the first test data transmitted to the data register circuit meets a predefined pattern and the transformation sequence of the operating state meets a predefined sequence including a pause data register state Pause-DR.

5. The system diagnostic circuit of the electronic system as recited in claim 1, wherein the control register circuit comprises:
    a passcode register circuit, having an input terminal coupled to an output terminal of the detect circuit to receive a part or a whole of the first test data transmitted to the data register circuit to serve as a passcode, wherein the passcode register circuit determines whether to enable an access function of a diagnostic logic circuit of the system diagnostic circuit for accessing at least one system device of the electronic system according to the passcode.

6. An electronic system, comprising:
    a routing circuit, configured to couple to a diagnosis host;
    at least one processor circuit, comprising a core circuit and a processor diagnostic circuit, wherein the processor diagnostic circuit is coupled to the routing circuit; and
    a system diagnostic circuit, controlling the routing circuit to determine a coupling relationship between the system diagnostic circuit, the processor diagnostic circuit, and the diagnosis host, wherein the system diagnostic circuit comprises an interface, a data register circuit, an instruction register circuit, a diagnostic controller circuit, a control register circuit, and a detect circuit, the interface is configured to receive a first test data, the data register circuit is an IDCODE register or a bypass register, the diagnostic controller circuit is configured to determine to transmit the first test data to the instruction register circuit or the data register circuit according to an operating state, the detect circuit is configured to update the control register circuit when the first test data transmitted to the data register circuit meets a predefined pattern, wherein the predefined pattern comprises a predefined preamble, and the first test data transmitted to the data register circuit comprises a preamble part, a data part, and an error checking code, and
    when the preamble part matches the predefined preamble and a calculation result obtained from calculating the first test data by an error checking calculation matches the error checking code, the first test data transmitted to the data register circuit is determined as meeting the predefined pattern.

7. The electronic system as recited in claim 6, wherein the interface comprising:
a test data input terminal, configured to receive the first test data;
a test data output terminal, configured to output a second test data; and
a test mode selection terminal, configured to receive a test mode selection signal.

8. The electronic system as recited in claim 6, wherein the predefined pattern comprises a predefined preamble, and the first test data transmitted to the data register circuit comprises a preamble part and a data part, when the preamble part matches the predefined preamble, the first test data transmitted to the data register circuit is determined as meeting the predefined pattern.

9. The electronic system as recited in claim 6, wherein the detect circuit further inspects a transformation sequence of the operating state of the system diagnostic circuit, and obtains an inspection result according to the transformation sequence of the operating state and the first test data transmitted to the data register circuit; and
wherein the detect circuit updates the control register circuit when the first test data transmitted to the data register circuit meets a predefined pattern and the transformation sequence of the operating state meets a predefined sequence including a pause data register state Pause-DR.

10. The electronic system as recited in claim 6, wherein the control register circuit comprises:
a passcode register circuit, having an input terminal coupled to the output terminal of the detect circuit to receive a part or a whole of the first test data transmitted to the data register circuit to serve as a passcode, wherein the passcode register circuit determines whether to enable an access function of a diagnostic logic circuit of the system diagnostic circuit for accessing at least one system device according to the passcode.

11. The electronic system as recited in claim 6, wherein the control register circuit comprises:
a selection register circuit, having an input terminal coupled to the output terminal of the detect circuit to receive a part or a whole of the first test data transmitted to the data register circuit to serve as a select operation, wherein the selection register circuit determines a coupling mode according to the select operation, and the coupling mode defines a coupling relationship between other diagnostic circuits of the electronic system and the diagnosis host.

12. The electronic system as recited in claim 6, wherein the routing circuit comprises:
an AND gate, wherein a first input terminal of the AND gate is coupled to the control register circuit of the system diagnostic circuit to receive a test access port enable signal, and a second input terminal of the AND gate is configured to couple to the diagnosis host so as to receive the test mode selection signal, an output terminal of the AND gate is coupled to a test mode selection signal input terminal of the processor diagnostic circuit.

13. An operation method of a system diagnostic circuit of an electronic system, comprising:
providing an interface to receive a first test data;
providing a data register circuit, wherein the data register circuit is an IDCODE register or a bypass register;
providing an instruction register circuit;
providing an operation state to determine to transmit the first test data to the instruction register circuit or the data register circuit according to the operating state; and
updating a control register circuit by a detect circuit when the first test data transmitted to the data register circuit meets a predefined pattern, wherein the predefined pattern comprises a predefined preamble, and the first test data transmitted to the data register circuit comprises a preamble part, a data part, and an error checking code, the step of determining whether to update the control register circuit with the first test data transmitted to the data register circuit further comprises:
determining the first test data transmitted to the data register circuit as meeting the predefined pattern when the preamble part matches the predefined preamble and a calculation result obtained from calculating the first test data by an error checking calculation meets the error checking code.

14. The operation method of the system diagnostic circuit as recited in claim 13, wherein the interface comprising:
a test data input terminal, configured to receive the first test data;
a test data output terminal, configured to output a second test data; and
a test mode selection terminal, configured to receive a test mode selection signal.

15. The operation method of the system diagnostic circuit as recited in claim 13, wherein the predefined pattern comprises a predefined preamble, and the first test data transmitted to the data register circuit comprises a preamble part and a data part, the step of determining whether to update the control register circuit with the first test data transmitted to the data register circuit further comprises:
determining the first test data transmitted to the data register circuit as meeting the predefined pattern when the preamble part matches the predefined preamble.

16. The operation method of the system diagnostic circuit as recited in claim 13, further comprising:
inspecting the transformation sequence of the operating state of the system diagnostic circuit by the detect circuit;
obtaining an inspection result according to the transformation sequence of the operating state and the first test data transmitted to the data register circuit;
wherein the detect circuit updates the control register circuit when the first test data transmitted to the data register circuit meets a predefined pattern and the transformation sequence of the operating state meets a predefined sequence including a pause data register state Pause-DR.

17. The operation method of the system diagnostic circuit as recited in claim 13, wherein the control register circuit comprises a passcode register circuit, the operation method further comprises:
updating the passcode register circuit with a part or a whole of the first test data transmitted to the data register circuit to serve as a passcode by the detect circuit; and
determining whether to enable an access function of a diagnostic logic circuit of the system diagnostic circuit for accessing at least one system device of the electronic system according to the passcode by the passcode register circuit.

18. The operation method of the system diagnostic circuit as recited in claim 13, wherein the control register circuit comprises a selection register circuit, the operation method further comprises:
- updating the selection register circuit with a part or a whole of the first test data transmitted to the data register circuit to serve as a select operation by the detect circuit; and
- determining a coupling mode according to the select operation by the selection register circuit, wherein the coupling mode defines the coupling relationship between other diagnostic circuits of the electronic system and the diagnosis host.

* * * * *